United States Patent
Cheek et al.

(10) Patent No.: US 8,494,172 B2
(45) Date of Patent: Jul. 23, 2013

(54) SYSTEM AND METHOD FOR ADJUSTING AUDIO INPUT AND OUTPUT SETTINGS

(75) Inventors: James K. Cheek, Richardson, TX (US); Yossef Twina, Rosh-Ha'ayin (IL)

(73) Assignee: Cardo Systems, Inc., Pittsburgh, PA (US)

(*) Notice: Subject to any disclaimer, the term of this patent is extended or adjusted under 35 U.S.C. 154(b) by 103 days.

(21) Appl. No.: 13/021,430

(22) Filed: Feb. 4, 2011

(65) Prior Publication Data
US 2012/0201393 A1 Aug. 9, 2012

(51) Int. Cl.
*H03G 3/20* (2006.01)

(52) U.S. Cl.
USPC ............ 381/57; 381/94.1; 381/107; 381/108; 381/86; 455/238.1

(58) Field of Classification Search
USPC ........... 381/57, 94.1, 107, 108, 86; 455/238.1
See application file for complete search history.

(56) References Cited

U.S. PATENT DOCUMENTS

| 4,558,460 A | * | 12/1985 | Tanaka et al. ................... 381/86 |
| 5,204,971 A | | 4/1993 | Takahashi et al. |
| 5,907,622 A | * | 5/1999 | Dougherty ...................... 381/57 |
| 2010/0239110 A1 | | 9/2010 | Lasch et al. |

FOREIGN PATENT DOCUMENTS
EP 1580883 9/2005

* cited by examiner

*Primary Examiner* — Vivian Chin
*Assistant Examiner* — Paul Kim
(74) *Attorney, Agent, or Firm* — Leason Ellis LLP

(57) ABSTRACT

Compensating for varying degrees of ambient noise in a mobile device. One possible noise compensation application has a plurality of selectable settings associated with a range of speeds of motion. This noise compensation application, when executed by the processor, configures the control circuit to: receive an input from the detector, detect an amplitude of the input, compare the amplitude with a selected one of the settings, and selectively adjust an amplification device when the detected amplitude is within a prescribed range. Another possible noise compensation application has plurality of selectable settings each associated with a range of audio frequencies. This noise compensation application, when executed by the processor, configures the control circuit to: receive an input from the detector, detect a frequency of the input, compare the frequency with a selected one of the settings, and selectively filter the ambient noise when the detected frequency is within a prescribed range.

20 Claims, 4 Drawing Sheets

SYSTEM AND METHOD FOR ADJUSTING AUDIO INPUT AND OUTPUT SETTINGS

TECHNICAL FIELD OF THE INVENTION

This disclosure relates generally to the field of audio enhancement, and, in particular, to systems and methods for adjusting input and output settings in response to various events and circumstances.

BACKGROUND OF THE INVENTION

With the proliferation of mobile communication technologies, in particular cellular phones, individuals have become accustomed to communicating with one another in situations and settings where communication was previously impossible. For instance, it is now common for individuals to conduct telephone conversations while traveling, and even while personally operating motor vehicles such as cars and motorcycles. In many cases, individuals who conduct telephone conversations while in transit utilize personal headsets that can be paired to one or more cellular devices through protocols such as the Bluetooth® wireless technology standard.

Most, if not all, cellular devices and/or Bluetooth® headsets are configured primarily for typical, stationary use. As a result, when these devices are utilized while in motion (often at significant rates of speed), considerable ambient noise is present which interferes with the typical operation of the phone and/or the headset's speaker(s) and/or microphone. For instance, when a driver increases his/her rate of speed, an increasing amount of ambient noise (such as from the revving of a motor vehicle's engine or the increased wind drag) generally makes it more difficult for the user to hear the sounds being emitted from the device's speaker. Furthermore, even if the user manually increases the device's volume setting to account for the increased ambient noise, when the user's rate of speed begins to decrease, the user will likely need to further modify the device's volume settings, or else maintain a volume level that may be uncomfortable.

This predicament is particularly pronounced for riders or drivers who wear helmets while operating various motor vehicles such as motorcycles, scooters, and all-terrain vehicles. Due to the driver's close proximity to the engine of the vehicle he/she rides, in addition to the wind drag occurring in close proximity to the driver's ear(s), helmet-wearers generally experience high-levels of ambient noise when communicating in transit.

Various attempts to address the problem of ambient noise in communication devices have been proffered. Generally, these approaches utilize a microphone to detect ambient noise, and the volume levels of the device are adjusted in response to the level of ambient noise detected by the microphone. However, these approaches contain several shortcomings. Firstly, the user is generally not given the option to adjust or customize the way in which the device will adjust for ambient noise (such as a minimum volume level below which the volume should never be adjusted, or a maximum volume level above which the volume should never be adjusted, irrespective of the detected ambient noise). Furthermore, presently available devices do not consider various circumstantial information (for instance, the class or particular model of motor vehicle that the user is driving, or the class or type of helmet that the user is wearing) which is relevant to the device's ability to account for ambient noise.

In a similar vein, the various circumstances and factors associated with mobile communication while in motion, as described in detail above, interfere with the optimal operation of the microphones of mobile communication devices and headsets. Ambient noise originating from various sources is detected by the microphone, and interferes with the clear reception and/or transmission of the user's voice.

While various attempts have been made to address this problem—many of them conceptually similar to those referenced above with regard to volume levels—these approaches have not enabled users to adjust and/or customize the way in which the ambient noise is compensated for, and further have not considered the various pertinent circumstantial information referenced above.

It is with respect to these and other considerations that the disclosure made herein is presented.

SUMMARY OF THE INVENTION

Technologies are presented herein for a system and method for compensating for varying degrees of ambient noise. According to one aspect, a system is provided, including a processor, a control circuit that is operatively connected to the processor, a memory that is operatively connected to the control circuit and also accessible by the processor, and a detector that is operatively connected to the control circuit. One or more software modules are encoded in the memory which execute a noise compensation application in the processor, and a plurality of selectable settings are stored in the memory, each being associated with a range of speeds of motion. An audio output device is operatively connected to the control circuit and an amplification device is operatively connected to the audio output device and the control circuit. The noise compensation application, when executed by the processor, configures the control circuit to: receive an input from the detector, detect an amplitude of the input, compare the amplitude with a selected one of the settings, and selectively adjust the amplification device when the detected amplitude is within a prescribed range.

According to another aspect, a system is provided, including a processor, a control circuit operatively connected to the processor, a memory operatively connected to the control circuit and accessible by the processor, and a detector operatively connected to the control circuit. One or more software modules are encoded in the memory which execute a noise compensation application in the processor, and a plurality of selectable settings are stored in the memory, each being associated with a range of audio frequencies. An audio input device is also operatively connected to the control circuit. The noise compensation application, when executed by the processor, configures the control circuit to: receive an input from the detector, detect a frequency of the input, compare the frequency with a selected one of the settings, and selectively filter the ambient noise when the detected frequency is within a prescribed range.

According to yet another aspect, a computer implemented method for compensating for varying degrees of ambient noise at a mobile device using a noise compensation application is provided. The mobile device has a processor, a control circuit, a memory having a plurality of selectable settings each being associated with a range of speeds of motion, a detector, an audio output device, and an amplification device. The noise compensation application has one or more software modules encoded in the memory and executed in the processor. An input is received from the detector and an amplitude of the input is detected. The amplitude is compared with a selected one of the settings, and the amplification device is selectively adjusted when the amplitude is within a prescribed range.

According to yet another aspect, a computer implemented method for compensating for varying degrees of ambient noise at a mobile device using a noise compensation application is provided. The mobile device has a processor, a control circuit, a memory having a plurality of selectable settings each being associated with a range of audio frequencies, a detector, and an audio input device. The noise compensation application has one or more software modules encoded in the memory and executed in the processor. An input is received from the detector and a frequency of the input is detected. The frequency is compared with a selected one of the settings, and the ambient noise is selectively filtered when the frequency is within a prescribed range.

These and other aspects, features, and advantages can be appreciated from the accompanying description of certain embodiments of the invention and the accompanying drawing figures.

DETAILED DESCRIPTION OF CERTAIN EMBODIMENTS OF THE INVENTION

The following detailed description is directed to systems and methods for compensating for varying degrees of ambient noise at a mobile device. References are made to the accompanying drawings that form a part hereof, and which are shown by way of illustration through specific embodiments, arrangements, and examples.

Figure 1:
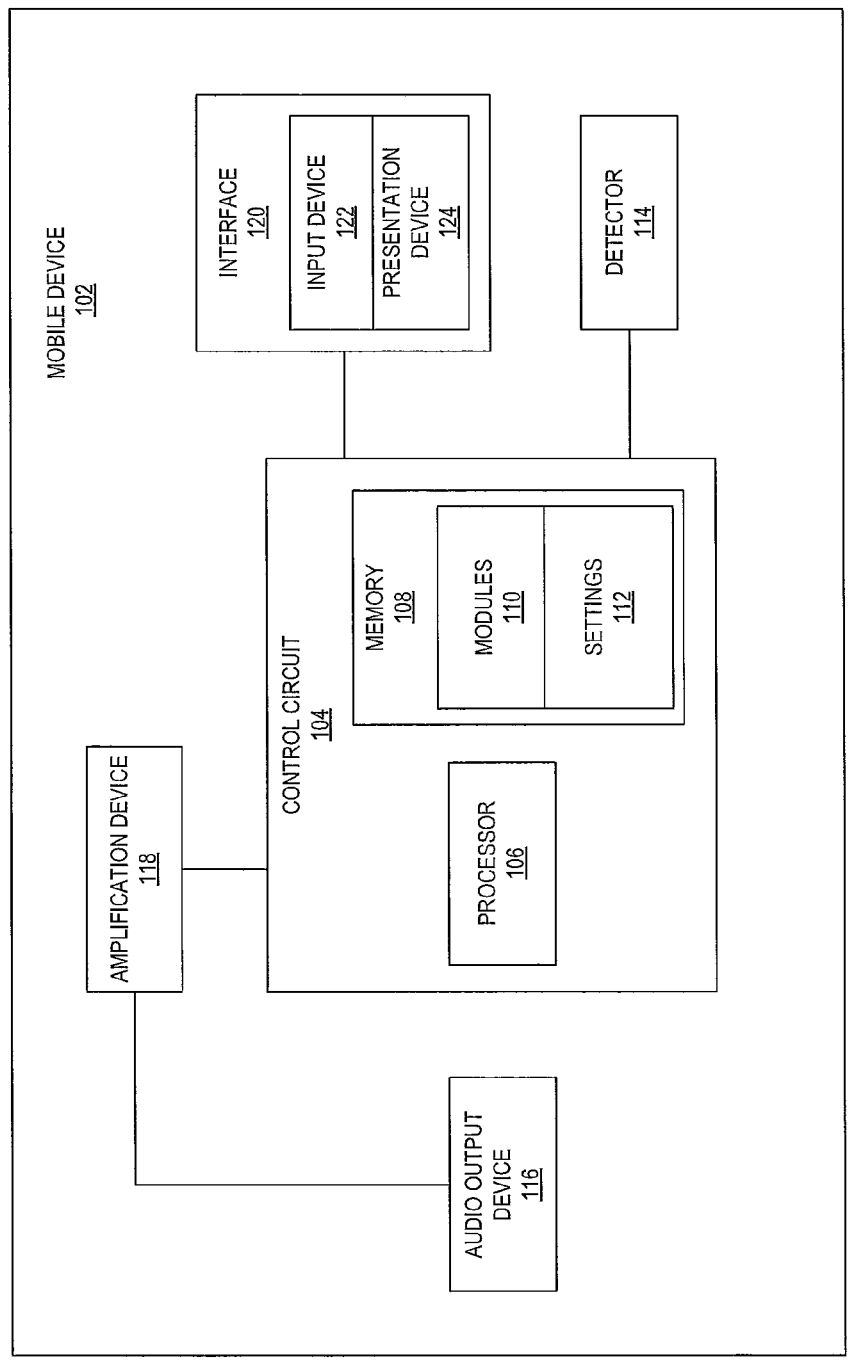
FIG. 1 is a high-level diagram of a mobile device in accordance with one exemplary embodiment.

Referring now to the drawings, it is to be understood that like numerals represent like elements through the several figures, and that not all components and/or steps described and illustrated with reference to the figures are required for all embodiments or arrangements. FIG. 1 is a high-level diagram illustrating an exemplary configuration of a mobile device 102. In one arrangement, mobile device 102 can be a communications headset such as a Bluetooth® headset. In another arrangement, mobile device 102 can be a mobile communication device such as a cellular phone or smartphone. In yet another arrangement, mobile device 102 can be a mobile audio and/or video player such as an iPod®, though it should be understood that mobile device 102 can be practically any device capable of embodying the systems and/or methods described herein.

Mobile device 102 includes a control circuit 104 which is operatively connected to various hardware and software components that serve to enable compensation for varying degrees of ambient noise at a mobile device 102. The control circuit 104 is operatively connected to a processor 106 and a memory 108. Preferably, memory 108 is accessible by processor 106, thereby enabling processor to receive and execute instructions stored on memory 108.

One or more software modules 110 are encoded in memory 108. The software modules 110 can comprise a software program or set of instructions executed in processor 106. Preferably, the software modules 110 make up a noise compensation application that is executed by processor 106. During execution of the software modules 110, the processor 106 configures the control circuit 104 to compensate for varying degrees of ambient noise, as will be described in greater detail below. It should be noted that while FIG. 1 depicts memory 108 on control circuit 104, in an alternate arrangement, memory 108 can be practically any storage medium (such as a hard disk drive, flash memory, etc.) that is operatively connected to the control circuit 106, even if not oriented on control circuit as depicted in FIG. 1.

Also stored in memory 108 are one or more settings 112. These settings 112 can be selected by a user, as will be described in detail below. Each setting has one or more parameters which correspond to various adjustments that can be made within mobile device 102 in order to compensate for various degrees of ambient noise, as will be described in greater detail below. One or more of settings 112 can be pre-defined and stored in memory 108, such that the settings 112 can be utilized at the time of the mobile device's 102 initial activation (as well as subsequently). In one arrangement, the user can modify, edit, and/or delete the parameters and/or the entirety of these pre-defined settings 112, as will be described in greater detail below. In another arrangement, a user can define new settings 112, as will also be described in greater detail below. Additionally, the user can select a default setting from among settings 112 which is to be applied in the absence of the selection of another setting. The various settings 112 are preferably associated with a range of speeds of motion, and further include parameters which dictate adjustments to be made to various components of mobile device 102 when certain speeds of motion are detected, as will be described in greater detail below.

An interface 120 is also operatively connected to control circuit 104. The interface 120 preferably includes one or more input device(s) 122 such as a switch, knob, button(s), key(s), touchscreen, etc. Interface 120 is operatively connected to the control circuit 104 and serves to receive a selected setting from among the selectable settings 112 stored in memory 108. By way of example, input device 122 of interface 120 can be a knob with three selectable levels corresponding to settings 112 of 'high', 'medium,' and 'low.' So, when the knob is moved from the 'low' position to the 'medium' position, interface 120 communicates this change to control circuit 104, and the setting corresponding to the 'medium' setting is applied, as will be described in greater detail below.

Interface 120 also enables a user to define a user setting to be stored among the selectable settings 112 in memory 108. As referenced above, while certain of the settings 112 are preferably pre-defined, it is preferable that the user also have the ability to customize existing settings, and/or to define user settings to conform to the user's personal preferences. In one arrangement, interface 120 further includes a display screen or any other such presentation device 124 which enables the user to view various options and parameters, and select among them using the input device(s) 122 referenced above. In another arrangement, the interface 120 can be implemented as a touchscreen, thereby combining the roles of the referenced input device 122 and presentation device 124. In yet another arrangement, either one or both of the input device 122 and presentation device 124 can be implemented in a non-visual and/or non-tactile fashion, such as by using a series of audio menus and/or voice commands/prompts to select and/or define settings 112.

In one arrangement, interface 120 further enables the defining of settings 112 by initiating and/or maintaining one or more communication sessions with an external device that is communicatively linked with mobile device 102. In one arrangement, interface 120 can connect with an external personal computer (PC) through a USB connection, Bluetooth connection, or any other connection/communication medium. The user can then utilize the connected PC to define user settings 112, and/or upload or otherwise communicate new settings which the user has previously defined and/or has obtained from an external source (such as the Internet). In another arrangement, interface 120 can connect with an external storage device, such as a USB flash drive, and receive one or more settings that are stored thereupon. In yet another arrangement, interface 120 can connect to one or more external servers through a network connection. For instance, interface 120 can utilize a pre-existing network connection, such as an Internet connection, present at mobile device 102. In doing so, the interface can connect with various remote servers which contain settings that are available for users to download. The user can download one or more desired settings and store them in memory 108. This functionality of interface 120, which enables the user to obtain and/or update the set of user settings 112 stored in memory 108, is of particular utility when used to obtain and/or update settings pertaining to specific protective helmets and/or motor vehicles, as will be described in greater detail below.

A detector 114 is also connected to control circuit 104. Preferably, detector 114 is a microphone that receives audible tones from the area immediately surrounding the mobile device 102. The audible tones received by the microphone are transduced into a signal and transmitted to control circuit 104 where they are analyzed for the purpose of compensating for varying degrees of ambient noise, as will be described in greater detail below.

It should be noted that while detector 114 is preferably a microphone, other devices can also be implemented as a detector 114. By way of example, a global positioning system (GPS) and/or an accelerometer can be implemented as detector 114, either in place of or in addition to the microphone referenced above. In such an arrangement, the GPS and/or the accelerometer can be used to detect the rate of speed that the mobile device 102 (and thus, the user) is traveling and provide information to control circuit 104 for analysis. This detected/provided speed can then be analyzed for the purpose of compensating for varying degrees of ambient noise, as will be described in greater detail below.

At this juncture, it should be noted that the selectable settings 112 discussed above include various settings that relate to the amount and/or degree of ambient noise that detector 114 is expected to detect. By way of example, settings 112 can include parameters relating to the specific type and/or class of protective helmet that a rider is wearing while using mobile device 102. Being that various protective helmets (such as motorcycle helmets) suppress varying degrees of ambient noise from arriving at the wearer's ears, by selecting and/or inputting a setting corresponding to a type and/or class of helmet, the user can customize the mobile device's 102 ability to better compensate for varying degrees of ambient noise in a manner described in greater detail below. By way of further example, settings 112 can include parameters relating to a specific motor vehicle model (such as a Harley-Davidson 'Fat Boy') and/or a class of motor vehicles (such as a motor scooter or moped). Being that various models and classes of motor vehicles create varying degrees of ambient noise, by selecting and/or inputting a setting corresponding to a specific model and/or class of motor vehicle being operated, the user can customize the mobile device's 102 ability to compensate for varying degrees of ambient noise in a manner described in greater detail below.

Also operatively connected to control circuit 104 is an audio output device 116, optionally through an amplification device 118, but always through a controllable amplification circuit. Preferably, audio output device 116 is a speaker or any other such device capable of transducing signals received from or originated at control circuit 104 (or elsewhere) and projecting audio that is audible to the user. In one arrangement, speaker 118 is configured as one or more earbuds or earmuffs which are constructed to rest within or directly upon or otherwise near a user's ear. In an alternate arrangement, audio output device 116 can be a loudspeaker for projecting tones in an enclosed area, for use like a speakerphone. The audio output device 116 receives analog communication signals from control circuit 104 by way of amplification device 118 and conveys them as audible tones to the user. The referenced tones can originate at the control circuit 104 (such as notification sounds relating to various system notifications), memory 108 (such as stored audio/video media), an external source (such as streaming media accessible by mobile device 102 through a network connection) and/or a communication device (such as from a telephone conversation).

An amplification device 118, such as an amplifier, can be operatively connected to the audio output device 116 and the control circuit 104. The amplification device 118 serves to amplify signals received from the control circuit 104 for output by the audio output device 116. The operation of the amplification device 118 is controlled by the control circuit, such that the amplification device 118 can amplify various signals at different levels of amplification based on various detected factors, as will be discussed in greater detail below. Alternatively, the control circuit 104 can include the amplification device circuitry. Without loss of generality, the controllable amplification is described in connection with a separate device 118.

It can now be appreciated that the selectable settings 112 referenced above are preferably associated with a range of speeds of motion. That is, settings 112 contain various parameters which configure the operation of amplification device 118 in various ways, depending upon the perceived rate of speed of mobile device 102. Thus, it is usually preferable that at high speeds (which generally result in higher levels of ambient noise), amplification device 118 amplifies signals for output by the audio output device 116 at a higher level, while at lower speeds (where ambient noise is often lower, amplification device 118 amplifies signals for output by the audio output device 116 at a lower level. The settings also preferably include parameters corresponding to various prescribed ranges of speeds. For example, from 0-30 miles per hour (MPH) apply a 'low' amplification level, from 30-60 MPH apply a 'medium' amplification level, and above 60 MPH apply a 'high' amplification level. Thus, when the user accelerates from 25 MPH to 35 MPH, the amplification device 118 increases the amplification from a 'low' level to a 'medium' level, in a manner described in greater detail below. Additionally, lower and upper limits can be defined in the various ranges such that upper limits can be designated, wherein the amplifier will not further amplify despite further increases in speed, and similarly lower limits can be defined, wherein the amplifier will not amplify below a specified limit, irrespective of how slowly the mobile device is traveling.

In order to compensate for the ambient noise present at a given speed, the selectable settings further include parameters which associate various speeds with levels of ambient noise. That is, while the user can define various settings to be associated with various ranges of speed (as described above), the noise compensation application, in conjunction with the settings 112 serves to correlate the user defined speeds and/or ranges of speed with levels of ambient noise. Thus, when detector 114 receives audible tones, these tones can be compared with the levels of ambient noise that are correlated with the defined speeds and/or ranges, as referenced above. In doing so, the noise compensation application can determine the appropriate amplification level for amplification device 118, as will be described in greater detail below. This assessment is further aided by selected settings 112 that correspond to the user's helmet and/or motor vehicle, as referenced above. These settings, which shed further light on the nature of the ambient noise detected by detector 114, thereby allow for greater accuracy in correlating defined ranges of speed with levels of ambient noise, as will be described in greater detail below. It should be noted that in an arrangement where detector 114 is a GPS and/or an accelerometer, the acceleration data generated by the GPS and/or the accelerometer can be utilized in addition to or in place of any detected audio tones.

In order to more fully illustrate the various functions and features disclosed herein, the following example is provided in accordance with one exemplary embodiment, though it should be understood that other embodiments, arrangements, and configurations are also possible:

The user can utilize interface 120 to define and/or select from among one or more settings 112, as described in detail above. Table 1 (below) illustrates a set of two settings—Setting 1 and Setting 2.

Adjustments' define ranges of speed for each setting, ranges of amplitudes which correspond to the ranges of speed, and amplification adjustments which are applied in order to compensate for the ambient noise associated with the various amplitude ranges. It should be noted that the 'Range of Speed' parameters are preferably defined by the user, and are preferably and primarily intended for the benefit of the user's reference. While the concept of amplitude levels and ranges is not one that many users relate to or fully appreciate, ranges of speed and the increasing noise levels that accompany them are much more accessible and readily understandable by the common user. Thus, the present system and accompanying method enable the user to define one or more ranges of speed, and further to identify how the amplification device 118 compensates for the increasing ambient noise that accompanies the various speeds. For example, in Setting 1, the user has defined that within the range of 25-40 MPH, the amplification device 118 should be adjusted to amplify sound to a degree 20% greater than the amplification device's 118 default or normal setting (The 'Amplification Adjustment' parameter is preferably defined by the user, and refers to the degree to which the amplification device 118 should amplify the sound emitted by audio output device 116 beyond the normal/default setting).

The 'Corresponding Amplitude' parameter is generally not defined by the user. Rather, these parameters are computed and/or received by the noise compensation application, and

TABLE 1

Example of User-Selectable Settings

| Parameter | Setting 1 (Default) | | | Setting 2 | | |
|---|---|---|---|---|---|---|
| Vehicle Type/Model | Harley-Davidson 'Fat Boy' Motorcycle | | | Moped | | |
| Protective Helmet Type/Class | Heavily Padded/Enclosed Helmet | | | Lightly Padded/Open Helmet | | |
| | Range of Speed | Corresponding Amplitude | Amplification Adjustment | Range of Speed | Corresponding Amplitude | Amplification Adjustment |
| Defined Speed Settings/Ranges, Corresponding Amplitudes, and Amplification Adjustments | <25 MPH | <35 dB | +10% | <15 MPH | <25 dB | — |
| | 25-40 MPH | 35-50 dB | +20% | 15-30 MPH | 25-45 dB | +20% |
| | 40-55 MPH | 50-75 dB | +35% | 30-40 MPH | 45-60 dB | +40% |
| | >55 MPH | >75 dB | +50% | >40 MPH | >60 dB | +50% |

In this example, Setting 1 has been designated as the 'Default' setting, as described above. Thus, if the user does not select a setting through interface 120, the parameters of Setting 1 are utilized.

Both Setting 1 and Setting 2 contain various parameters which can be defined by the user. Among these parameters are 'Vehicle Type/Model,' which corresponds to the specific vehicle the user is operating or riding in. For instance, Setting 1 designates a 'Harley-Davidson Fat Boy Motorcycle,' while Setting 2 designates a 'Moped.' Identifying the user's vehicle type is significant, as different types of vehicles will produce greater or lesser degrees of ambient noise at different speeds. Similarly, the 'Protective Helmet Type/Class' parameter is significant, because different types of helmets suppress varying amounts of ambient noise at different speeds. For instance, the 'Heavily Padded/Enclosed Helmet' of Setting 1 generally suppresses more ambient noise than the 'Lightly Padded/Open Helmet' of Setting 2.

The parameters associated with 'Defined Speed Settings/Ranges, Corresponding Amplitudes, and Amplification are correlated with the user defined 'Range of Speed' and 'Amplification Adjustment' parameters, as depicted in Table 1. Based on the totality of user-defined settings (such as 'Vehicle Type/Model,' 'Protective Helmet Type/Class,' and 'Range of Speed'), the noise compensation application computes ranges of amplitudes (designated by the 'Corresponding Amplitude' parameter) that correspond to the user-defined ranges of speed. Although the system, according to the present embodiment, cannot detect the actual speed at which mobile device 102 is traveling, the system nevertheless enables the user to define amplification adjustments that correspond to the more familiar and tangible ranges of speed, and then converts these ranges into ranges of amplitudes which are perceptible by mobile device 102 through detector 114, as described above. Thus, the system itself actually receives an audio input from the detector 114, and compares the input's amplitude with the range of amplitudes in the 'Corresponding Amplitude' parameter. Upon identifying the appropriate range, the system adjusts the amplification device 118 in accordance with the corresponding 'Amplification Adjustment' parameter, as described in detail above. So, for example, upon selecting 'Setting 2,' when detector 114 receives an input with an amplitude of 50 dB, the amplification device 118 is adjusted to increase its amplification 40% above its default/normal operation.

As referenced above, upper and lower limit parameters can be defined. Thus, for example, in Setting 1, any speed below 25 MPH, which corresponds to any amplitude level below 35 dB, results in an amplification increase of 10% above the normal/default amplification setting. In such a case, even if the detector 114 receives no perceptible input (0 dB), the amplification device 118 will still be increased to 10% above the normal/default amplification setting. Similarly, with reference to Setting 2, any speed above 40 MPH, which corresponds to any amplitude level above 60 dB, results in an amplification increase of 50% above the normal/default amplification. Irrespective of how high of an amplitude level above 60 dB the detector 114 perceives, under Setting 2 the amplification device 118 will never be increased beyond 50% above its normal/default operation. In doing so, the upper limit parameter ensures the safety of both the audio output device 116 and the user's ears by not increasing the amplification level to an unsafe degree.

It should be noted that while the preceding example has made reference to the fact that the 'Corresponding Amplitude' parameter is not input by the user (rather, it is generated by the noise compensation application, as described above), in other arrangements the user may input and/or edit the 'Corresponding Amplitude' parameter as well, thereby providing the user with an additional degree of control and customization.

The operation of the mobile device 102 and the various elements described above will be appreciated with reference to the method for compensating for varying degrees of ambient noise at a mobile device, as described below, in conjunction with FIG. 2.

Figure 2:
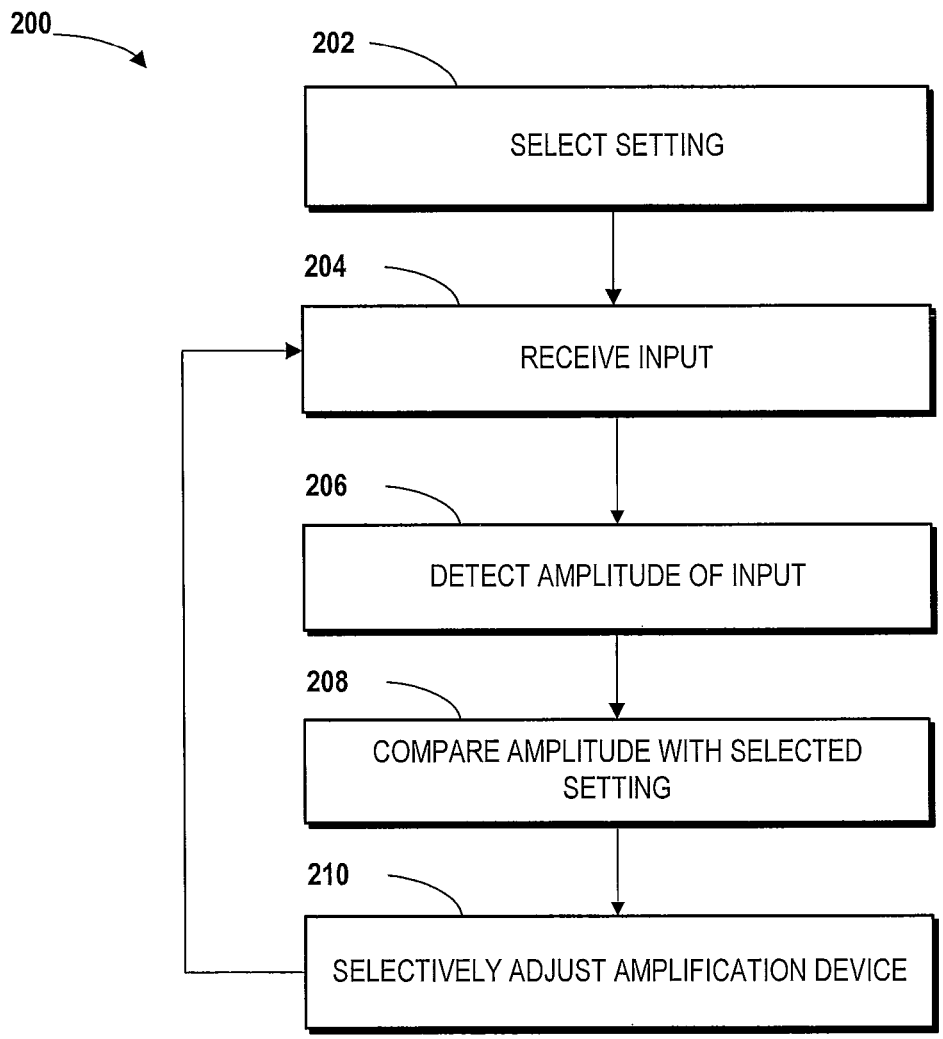
FIG. 2 is a flow diagram illustrating a method for compensating for varying degrees of ambient noise at a mobile device in accordance with one exemplary embodiment.

Turning now to FIG. 2, a flow diagram is described showing a routine 200 that illustrates a broad aspect of a method for compensating for varying degrees of ambient noise at a mobile device in accordance with at least one embodiment disclosed herein. It should be appreciated that several of the logical operations described herein are implemented (1) as a sequence of computer implemented acts or program modules running on mobile device 102 and/or (2) as interconnected machine logic circuits or circuit modules within the mobile device 102. The implementation is a matter of choice dependent on the requirements of the device (e.g., size, energy, consumption, performance, etc.). Accordingly, the logical operations described herein are referred to variously as operations, structural devices, acts, or modules. Various of these operations, structural devices, acts and modules can be implemented in software, in firmware, in special purpose digital logic, and any combination thereof. It should also be appreciated that more or fewer operations can be performed than shown in the figures and described herein. These operations can also be performed in a different order than those described herein.

The process begins at step 202, where the user selects one or more settings 112 using interface 120, as referenced above. Alternatively, the user has the option of bypassing this step, and in such a scenario the default setting(s), and/or the most recently selected setting are applied. Then, at step 204, one or more inputs are received by detector 114. As noted above, detector 114 is preferably a microphone, and the various detected inputs are thus audio tones.

At step 206, the processor 106 executes one or more of the software modules 110 in conjunction with the settings 112 in order to configure the control circuit to detect one or more amplitudes of the input received from the detector 114. Then, at step 208, these detected amplitude(s) are compared with one or more selected settings 112, specifically settings which correlate between levels of ambient noise and defined speeds and/or ranges of speed, as referenced above. In doing so, the noise compensation application is able to identify the appropriate user-selected speed setting to apply based on the detected amplitude of the audio input. Then, at step 210, when the detected amplitude is within one of the prescribed ranges (as defined in settings 112), the processor 106 executes one or more of the software modules 110 in conjunction with the settings 112 in order to configure the control circuit to selectively adjust amplification device 118. In doing so, the control circuit 104 serves to compensate for perceived levels of ambient noise by adjusting the operation of amplification device 118. The process then continues by returning to step 204, where further inputs are received by detector 114.

Figure 3:
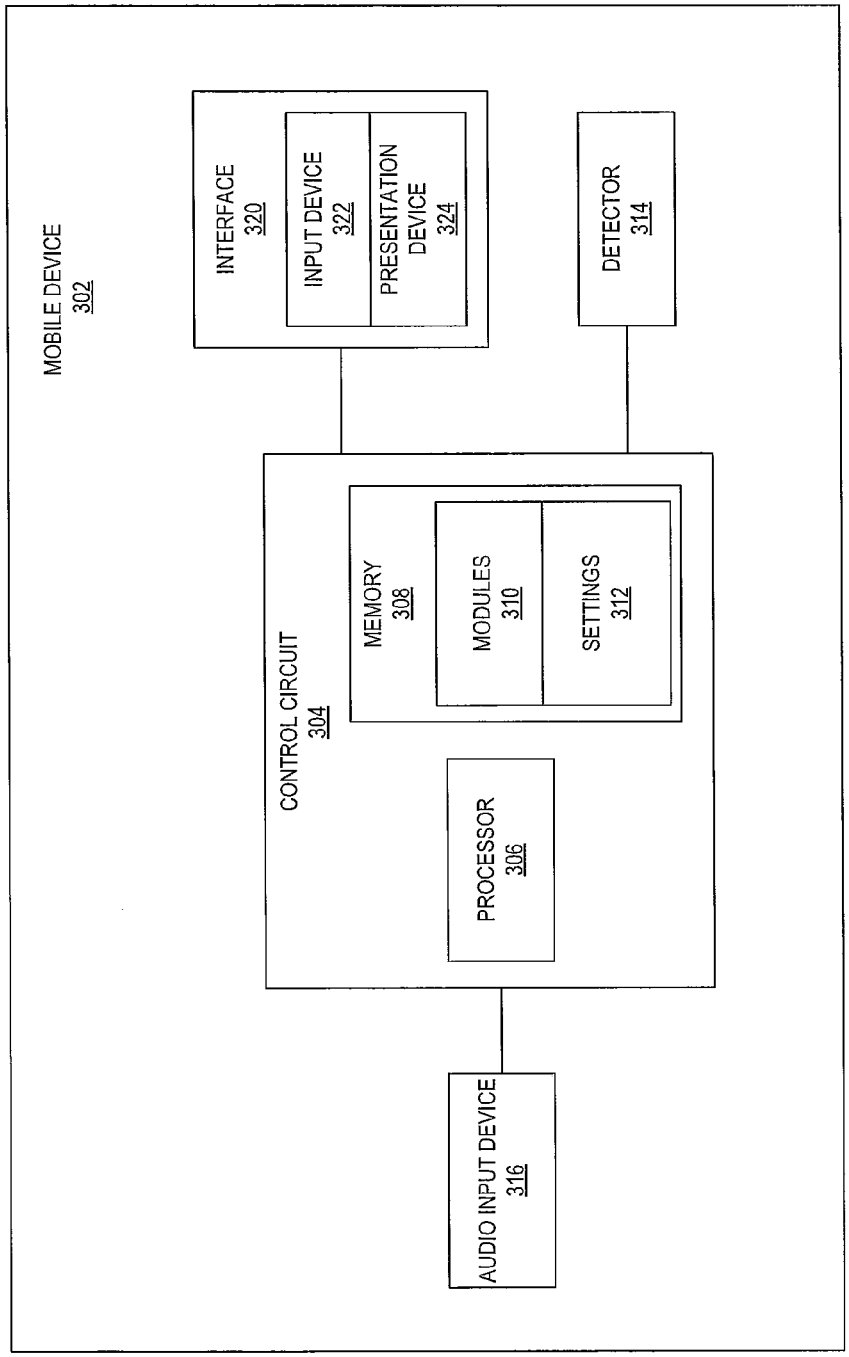
FIG. 3 is a high-level diagram of a mobile device in accordance with another exemplary embodiment.

Turning now to FIG. 3, a high-level diagram of a mobile device 302 in accordance with another exemplary embodiment is provided. The embodiment of FIGS. 3-4 addresses microphone gain issues, and this embodiment can be used in conjunction with the arrangement and method of FIGS. 1-2, if desired. In one arrangement, mobile device 302 can be a communications headset such as a Bluetooth® headset. In another arrangement, mobile device 302 can be a mobile communication device such as a cellular phone or smartphone, though it should be understood that mobile device 102 can be practically any device capable of embodying the systems and/or methods described herein.

Mobile device 302 includes a control circuit 304 which is operatively connected to various hardware and software components that serve to enable compensation for varying degrees of ambient noise at a mobile device 302. The control circuit 304 is operatively connected to a processor 306 and a memory 308. Preferably, memory 308 is accessible by processor 306, thereby enabling processor to receive and execute instructions stored on memory 308.

One or more software modules 310 are encoded in memory 308. The software modules 310 can comprise a software program or set of instructions executed in processor 306. Preferably, the software modules 310 make up a noise compensation application that is executed by processor 306. During execution of the software modules 310, the processor 306 configures the control circuit 304 to compensate for varying degrees of ambient noise, as will be described in greater detail below. It should be noted that while FIG. 3 depicts memory 308 on control circuit 304, in an alternate arrangement, memory 308 can be practically any storage medium (such as a hard disk drive, flash memory, etc.) that is operatively connected to the control circuit 306, even if not oriented on control circuit as depicted in FIG. 3.

Also stored in memory 308 are one or more settings 312. These settings 312 can be selected by a user, as will be described in detail below. Each setting has one or more parameters which correspond to various adjustments that can be made within mobile device 302 in order to compensate for various degrees of ambient noise, as will be described in greater detail below. One or more of settings 312 can be pre-defined and stored in memory 308, such that the settings 312 can be utilized at the time of the mobile device's 302 initial activation (as well as subsequently). In one arrangement, the user can modify, edit, and/or delete the parameters and/or the entirety of these pre-defined settings 312, as will be described in greater detail below. In another arrangement, a user can define new settings 312, as will also be described in greater detail below. Additionally, the user can select a default setting from among settings 312 which is to be applied in the absence of the selection of another setting. The various settings 312 are preferably associated with one or more range(s) of audio frequencies, and further include parameters which dictate adjustments to be made to various components of mobile device 302 when certain frequencies are detected, as will be described in greater detail below.

An interface 320 is also operatively connected to control circuit 304. The interface 120 preferably includes one or more input device(s) 322 such as a switch, knob, button(s), key(s), touchscreen, etc. Interface 320 is operatively connected to the control circuit 304 and serves to receive a selected setting from among the selectable settings 312 stored in memory 308. By way of example, input device 322 of interface 120 can be a knob with three selectable levels corresponding to settings 312 of 'high', 'medium,' and 'low.' So, when the knob is moved from the 'low' position to the 'medium' position, interface 320 communicates this change to control circuit 104, and the setting corresponding to the 'medium' setting is applied, as will be described in greater detail below.

Interface 320 also enables a user to define a user setting to be stored among the selectable settings 312 in memory 308. As referenced above, while certain of the settings 312 are preferably pre-defined, it is preferable that the user also have the ability to customize existing settings, and/or to define user settings to conform to the user's personal preferences. In one arrangement, interface 320 further includes a display screen or any other such presentation device 324 which enables the user to view various options and parameters, and select among them using the input device(s) 322 referenced above. In another arrangement, the interface 320 can be implemented as a touchscreen, thereby combining the roles of the referenced input device 322 and presentation device 324. In yet another arrangement, either one or both of the input device 322 and presentation device 324 can be implemented in a non-visual and/or non-tactile fashion, such as by using a series of audio menus and/or voice commands/prompts to select and/or define settings 312.

In one arrangement, interface 320 further enables the defining of settings 312 by initiating and/or maintaining one or more communication sessions with an external device that is communicatively linked with mobile device 302. In one arrangement, interface 320 can connect with an external personal computer (PC) through a USB connection, Bluetooth connection, or any other connection/communication medium. The user can then utilize the connected PC to define user settings 312, and/or upload or otherwise communicate new settings which the user has previously defined and/or has obtained from an external source (such as the Internet). In another arrangement, interface 320 can connect with an external storage device, such as a USB flash drive, and receive one or more settings that are stored thereupon. In yet another arrangement, interface 320 can connect to one or more external servers through a network connection. For instance, interface 320 can utilize a pre-existing network connection, such as an Internet connection, present at mobile device 302. In doing so, the interface can connect with various remote servers which contain settings that are available for users to download. The user can download one or more desired settings and store them in memory 308.

Also operatively connected to control circuit 304 is an audio input device 316. Preferably, audio input device 316 is a microphone that receives audible tones from the area immediately surrounding the mobile device 302. The audible tones received by the microphone are transduced into a signal and transmitted to control circuit 304 where they are analyzed for the purpose of compensating for varying degrees of ambient noise, as will be described in greater detail below.

A detector 314 is also connected to control circuit 304. Preferably, detector 314 is a microphone that receives audible tones from the area immediately surrounding the mobile device 302. In one arrangement, audio input device 316 and detector 314 can be the same microphone, while in other arrangements they can be employed as separate microphones. The audible tones received by the microphone of detector 314 are transduced into a signal and transmitted to control circuit 104 where they are analyzed for the purpose of compensating for varying degrees of ambient noise, as will be described in greater detail below.

At this juncture, it should be noted that the selectable settings 312 discussed above include various settings that relate to the amount and/or degree of ambient noise that detector 314 and/or audio input device 316 are expected to detect. By way of example, settings 312 can include parameters relating to a range of audio frequencies that correspond to ambient noise, such as engine sounds, vehicle honking, etc. In various travel situations (such as driving in an urban area during a period of heavy traffic), the user can select a setting corresponding to a range of audio frequencies, thereby customizing the mobile device's 302 ability to compensate for varying degrees of ambient noise in a manner described in greater detail below.

In order to compensate for the ambient noise present in various situations, the selectable settings include parameters which correspond to a range of audio frequencies associated with ambient noise. Thus, for example, a 'high' setting can be set to only detect high level frequencies, while a 'low' setting will detect lower level frequencies as well. The noise compensation application, in conjunction with the settings 312 serves to compare the frequencies detected by the detector 314 with the range of frequencies of the selected setting 312. Based on the parameters of the selected setting 312, the noise compensation application can filter out varying levels of ambient noise received by audio input device 316. In doing so, the noise compensation application improves the quality of the audio signals received by audio input device 316 by filtering elements identified as ambient noise in accordance with the selected setting 312, as will be described in greater detail below.

The operation of the mobile device 302 and the various elements described above will be appreciated with reference to the method for compensating for varying degrees of ambient noise at a mobile device, as described below, in conjunction with FIG. 4.

Figure 4:
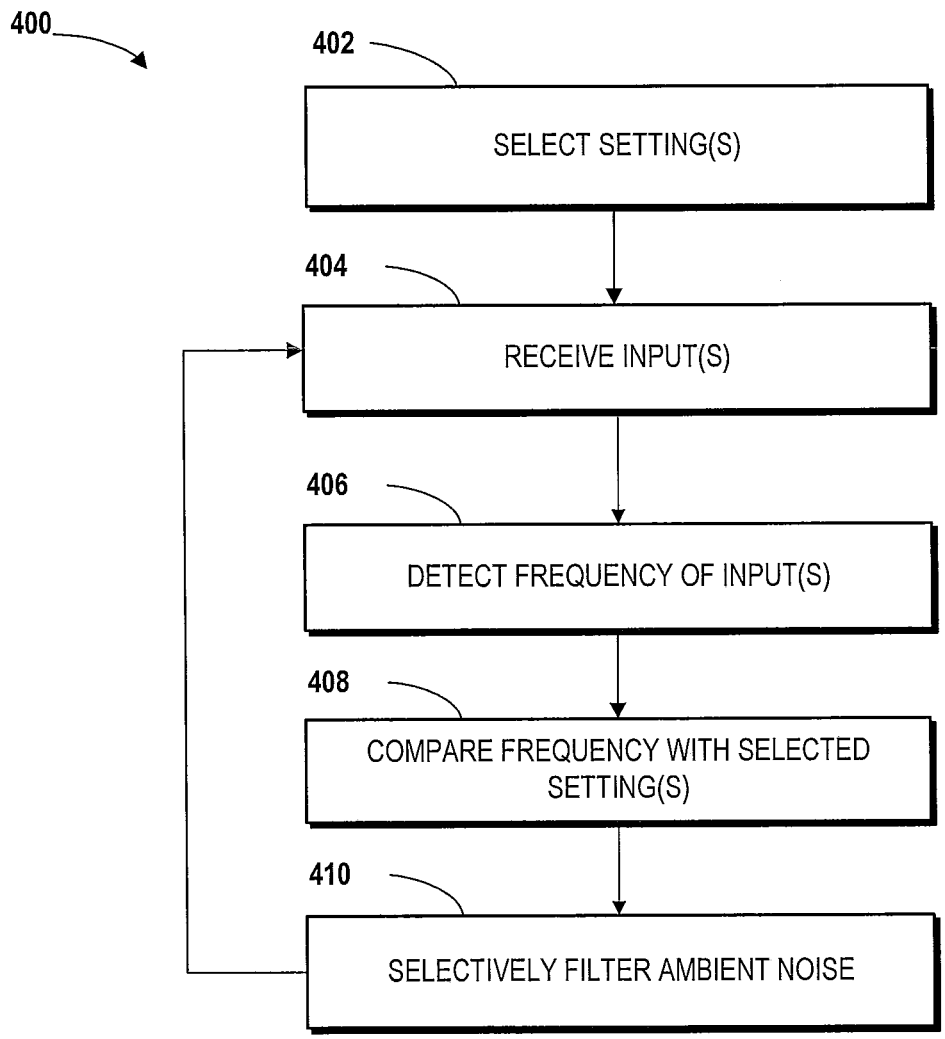
FIG. 4 is a flow diagram illustrating a method for compensating for varying degrees of ambient noise at a mobile device in accordance with another exemplary embodiment.

Turning now to FIG. 4, a flow diagram is described showing a routine 400 that illustrates a broad aspect of a method for compensating for varying degrees of ambient noise at a mobile device in accordance with at least one embodiment disclosed herein. It should be appreciated that several of the logical operations described herein are implemented (1) as a sequence of computer implemented acts or program modules running on mobile device 302 and/or (2) as interconnected machine logic circuits or circuit modules within the mobile device 302. The implementation is a matter of choice dependent on the requirements of the device (e.g., size, energy, consumption, performance, etc.). Accordingly, the logical operations described herein are referred to variously as operations, structural devices, acts, or modules. Various of these operations, structural devices, acts and modules can be implemented in software, in firmware, in special purpose digital logic, and any combination thereof. It should also be appreciated that more or fewer operations can be performed than shown in the figures and described herein. These operations can also be performed in a different order than those described herein.

The process begins at step 402, where the user selects one or more settings 312 using interface 320, as referenced above. Alternatively, the user has the option of bypassing this step, and in such a scenario the default setting(s), and/or the most recently selected setting are applied. Then, at step 404, one or more inputs are received by detector 314 and audio input device 316. As noted above, both detector 314 and audio input device 316 are preferably microphone(s), and the various detected inputs are thus audio tones.

At step 406, the processor 306 executes one or more of the software modules 310 in conjunction with the settings 312 in order to configure the control circuit to detect one or more frequencies of the one or more input(s) received from detector 314 and/or audio input device 316. Then, at step 408, these detected frequencies are compared with one or more selected settings 312, as referenced above. In doing so, the noise compensation application is able to identify the frequency levels that are to be filtered out as ambient noise based on the parameters of the selected setting 312. Then, at step 410, when the detected frequency is within one of the prescribed ranges (as defined in settings 312), the processor 306 executes one or more of the software modules 310 in conjunction with the settings 312 in order to configure the control circuit 304 to selectively filter the ambient noise associated with the detected frequencies. The process then continues by returning to step 404, where further inputs are received by detector 314.

It should be appreciated that several of the logical operations described herein are implemented (1) as a sequence of computer implemented acts or program modules running on communication device 104 and/or (2) as interconnected machine logic circuits or circuit modules within the communication device 104. The implementation is a matter of choice dependent on the performance and other requirements of the device. Accordingly, the logical operations described herein are referred to variously as operations, structural devices, acts, or modules. Various of these operations, structural devices, acts and modules can be implemented in software, in firmware, in special purpose digital logic, and any combination thereof. It should also be appreciated that more or fewer operations can be performed than shown in the figures and described herein. These operations can also be performed in a different order than those described herein.

The subject matter described above is provided by way of illustration only and should not be construed as limiting. Various modifications and changes can be made to the subject matter described herein without following the example embodiments and applications illustrated and described, and without departing from the true spirit and scope of the present invention, which is set forth in the following claims.

What is claimed is:

1. A system for compensating for varying degrees of ambient noise, the system comprising:
   a processor;
   a control circuit operatively connected to the processor;
   a memory operatively connected to the control circuit and accessible by the processor;
   a detector operatively connected to the control circuit;
   one or more software modules encoded in the memory which execute a noise compensation application in the processor, wherein the noise compensation application comprises a plurality of selectable settings arranged in two or more sets, each of the sets comprising two or more of the settings, and further wherein the settings refer to at least vehicle type, helmet type, speed, amplitude and amplification adjustment, further wherein at least one of the settings is customizable by a user, and further wherein at least one of the settings is selectable by the user during operation;
   an audio output device operatively connected to the control circuit; and
   an amplification device operatively connected to the audio output device and the control circuit;
   wherein the noise compensation application, when executed by the processor, configures the control circuit to:
   receive an input from the detector;
   detect an amplitude of the input;
   compare the amplitude with a selected one of the settings; and
   selectively adjust the amplification device when the detected amplitude is within a prescribed range.

2. The system of claim 1, wherein the detector comprises a microphone.

3. The system of claim 1, further comprising an interface configured to receive the selected one of the settings from among the selectable settings.

4. The system of claim 1, further comprising an interface for defining a user setting to be stored among the selectable settings.

5. The system of claim 1, wherein the selectable settings include settings associated with at least one of a helmet type and a class of helmets.

6. The system of claim 1, wherein the selectable settings include settings associated with at least one of a motor vehicle model and a class of motor vehicles.

7. The system of claim 1, wherein the prescribed range has an upper limit.

8. The system of claim 1, wherein the prescribed range has a lower limit.

9. The system of claim 4, wherein the interface is configured to communicate with at least one computing device.

10. The system of claim 9, wherein the interface is further configured to obtain at least one selectable setting from the at least one computing device, and to include the at least one selectable setting with the plurality of selectable settings.

11. A system for compensating for varying degrees of ambient noise, the system comprising:
   a processor;
   a control circuit operatively connected to the processor;
   a memory operatively connected to the control circuit and accessible by the processor;
   a detector operatively connected to the control circuit;
   one or more software modules encoded in the memory which execute a noise compensation application in the processor;
   the noise compensation application comprising a plurality of selectable settings arranged in two or more sets, each of the sets comprising two or more of the settings, and further wherein the settings refer to at least vehicle type, helmet type, speed, amplitude and amplification adjustment, further wherein at least one of the settings is customizable by a user, and further wherein at least one of the settings is selectable by the user during operation;
   an audio input device operatively connected to the control circuit;
   wherein the noise compensation application, when executed by the processor, configures the control circuit to:
   receive an input from the detector;
   detect a frequency of the input;

compare the frequency with a selected one of the settings; and selectively filter the ambient noise when the detected frequency is within a prescribed range.

12. The system of claim 11, wherein the detector comprises the audio input device.

13. The system of claim 11, wherein the detector comprises a secondary audio input device.

14. The system of claim 11, further comprising an interface configured to receive the selected one of the settings from among the selectable settings.

15. The system of claim 11, further comprising an interface for defining a user setting to be stored among the selectable settings.

16. A computer implemented method for compensating for varying degrees of ambient noise at a mobile device using a noise compensation application, the mobile device having a processor, a control circuit, and a memory, and the noise compensation application having one or more software modules encoded in the memory and executed in the processor, the noise compensation further application comprising a plurality of selectable settings arranged in two or more sets, each of the sets comprising two or more of the settings, and further wherein the settings refer to at least vehicle type, helmet type, speed, amplitude and amplification adjustment, further wherein at least one of the settings is customizable by a user, and further wherein at least one of the settings is selectable by the user during operation, the method comprising:

receiving an input from the detector;

detecting an amplitude of the input;

comparing the amplitude with a selected one of the settings; and selectively adjusting the amplification device when the amplitude is within a prescribed range.

17. The method of claim 16, further comprising the step of: selecting a setting from among the settings.

18. A computer implemented method for compensating for varying degrees of ambient noise at a mobile device using a noise compensation application, the mobile device having a processor, a control circuit, a memory having a plurality of selectable settings arranged in two or more sets, each of the sets comprising two or more of the selectable settings, and further wherein the selectable settings refer to at least vehicle type, helmet type, speed, amplitude and amplification adjustment, further wherein at least one of the settings is customizable by a user, and further wherein at least one of the settings is selectable by the user during operation, a plurality of selectable settings, each being associated with a range of audio frequencies and each being associated with a respective corresponding degree of filtering, at least one of the selectable settings being further customizable by a user, a detector, and an audio input device, and the noise compensation application having one or more software modules encoded in the memory and executed in the processor, the method comprising:

receiving an input from the detector;

detecting a frequency of the input;

comparing the frequency with a selected one of the settings; and selectively filtering the ambient noise when the frequency is within a prescribed range.

19. The method of claim 18, further comprising the step of: selecting a setting from among the settings.

20. The method of claim 18, further comprising the step of: receiving an input from the audio input device.

* * * * *